(12) United States Patent
Chen et al.

(10) Patent No.: US 7,598,592 B2
(45) Date of Patent: Oct. 6, 2009

(54) CAPACITOR STRUCTURE FOR INTEGRATED CIRCUIT

(75) Inventors: Chun-Sheng Chen, Taipei (TW); Ying-Che Tseng, Taipei (TW)

(73) Assignee: Via Technologies, Inc., Taipei (TW)

(*) Notice: Subject to any disclaimer, the term of this patent is extended or adjusted under 35 U.S.C. 154(b) by 305 days.

(21) Appl. No.: 11/675,721

(22) Filed: Feb. 16, 2007

(65) Prior Publication Data
US 2008/0128859 A1 Jun. 5, 2008

(30) Foreign Application Priority Data
Dec. 5, 2006 (TW) .............................. 95145128 A

(51) Int. Cl.
*H01L 27/108* (2006.01)
(52) U.S. Cl. ................... 257/534; 257/307; 257/532; 257/E27.048; 257/E21.012
(58) Field of Classification Search ................. 257/288, 257/296, 303, 306, 307, 534, 516, 528, 532, 257/E21.002, E21.003, E21.008, E27.01, 257/E27.013, E27.016, E29.342, E29.343; 361/306.2, 306.3
See application file for complete search history.

(56) References Cited

U.S. PATENT DOCUMENTS 5,583,359 A 12/1996 Ng et al.
6,385,033 B1 * 5/2002 Javanifard et al. ........ 361/306.2
6,819,542 B2 11/2004 Tsai et al.
2004/0174655 A1 9/2004 Tsai et al.

FOREIGN PATENT DOCUMENTS

WO WO2005/062355 7/2005

OTHER PUBLICATIONS

TW office action mailed Jul. 15, 2009.

* cited by examiner

*Primary Examiner*—A. Sefer
*Assistant Examiner*—Ermias Woldegeorgis
(74) *Attorney, Agent, or Firm*—Thomas, Kayden, Horstemeyer & Risley

(57) ABSTRACT

A capacitor structure for an integrated circuit. An insulating layer is disposed on a substrate. A first conductive line is embedded in a first level of the insulating layer. A second conductive line is embedded in a second level of the insulating layer lower than the first level and has a projection onto the substrate completely covered by the first conductive line. A third conductive line is embedded in the second level of the insulating layer and separated from the second conductive line by a predetermined space, and has a projection onto the substrate partially covered by the first conductive line. The second conductive line is coupled to the first conductive line by at least one first conductive plug and has a polarity opposite to the third conductive line.

21 Claims, 9 Drawing Sheets

CAPACITOR STRUCTURE FOR INTEGRATED CIRCUIT

BACKGROUND OF THE INVENTION

1. Field of the Invention

The invention relates to integrated circuit design and, in particular, to a lateral capacitor structure for an integrated circuit capable of mitigating capacitor mismatch.

2. Description of the Related Art

Many digital and analog elements and circuits have been successfully applied to semiconductor integrated circuits. Such elements may include passive components, such as resistors, capacitors, or inductors. Typically, a semiconductor integrated circuit includes a silicon substrate. One or more dielectric layers are disposed on the substrate, with one or more metal layers disposed in the insulating layers. The metal layers may be employed to form on-chip elements, such as on-chip metal-insulator-metal (MIM) capacitor, by current semiconductor technologies.

Conventionally, the on-chip MIM capacitor includes two flat conductive plates, with one parallel to and on the top of the other, and an intervening layer of dielectric material. Such a capacitor structure has a drawback of a larger required chip area. Moreover, additional lithography and etching for formation of the top plate results in increased manufacturing cost.

One approach to reduce the required chip area of the MIM capacitor involves the use of a layer of parallel interdigitated conductive lines as electrode plates having a dielectric material therebetween. Such a capacitor structure provides higher capacitance per unit area, as a result of the increased capacitance afforded by vertical MIM capacitors formed by the opposing top and bottom electrode plates, and lateral MIM capacitors formed by the adjacent electrode plates. FIG. 1 illustrates a conventional parallel interdigitated capacitor structure for an integrated circuit. The capacitor structure includes a dielectric layer 102 disposed on a semiconductor substrate 100. A conductive line pattern is embedded in a first level of the dielectric layer 102, comprising a plurality of parallel metal lines 105 separated by a predetermined space. The adjacent metal lines 105 have opposing polarity and are labeled by "+" and "−". Another conductive line pattern is embedded in a second level of the dielectric layer 102 lower than the first level, comprising a plurality of parallel metal lines 103 separated by the predetermined space. The plurality of metal lines 103 is substantially aligned with the plurality of metal lines 105 and each metal line 103 has polarity opposed with the corresponding metal line 105, labeled by "+" and "−". The adjacent metal lines 105 and the adjacent metal lines 103 form lateral capacitors, respectively, and the metal lines 105 and the corresponding metal lines 103 form vertical capacitors.

The metal lines 103 and 105, acting as electrode plates of capacitors, are typically formed by damascene technology. During formation of the metal lines 103 and 105 or planarization of the insulating layer 102, dishing is induced due to the effects of chemical mechanical polishing (CMP) on dielectric layer 102. MIM capacitor mismatch is worsened because the metal lines 103 and 105 are embedded in the uneven dielectric layer 102. As a result, the performance of integrated circuits is affected.

Thus, there exists a need in the art for an improved capacitor structure design capable of mitigating capacitor mismatch.

BRIEF SUMMARY OF INVENTION

A detailed description is given in the following embodiments with reference to the accompanying drawings.

A capacitor structure for an integrated circuit is provided. An embodiment of a capacitor structure for an integrated circuit comprises an insulating layer disposed on a substrate. A first conductive line is embedded in a first level of the insulating layer. A second conductive line is embedded in a second level of the insulating layer lower than the first level and has a projection onto the substrate completely covered by the first conductive line. A third conductive line is embedded in the second level of the insulating layer and separated from the second conductive line by a predetermined space, and has a projection onto the substrate partially covered by the first conductive line. The second conductive line is coupled to the first conductive line by at least one first conductive plug and has a polarity opposite to the third conductive line.

Another embodiment of a capacitor structure for an integrated circuit comprises an insulating layer disposed on a substrate. A first conductive line pattern is embedded in a first level of the insulating layer and comprises a plurality of parallel first conductive lines separated by a first space, wherein the adjacent first conductive lines have opposing polarities. A second conductive line pattern is embedded in a second level of the insulating layer lower than the first level and comprises a plurality of parallel second conductive lines separated by the first space. The second conductive line pattern shifts in a predetermined direction with respect to the first conductive line pattern by a second space and each first conductive line is coupled to a corresponding and shifted second conductive line by at least one first conductive plug.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated modes of carrying out the invention. This description is provided for the purpose of illustrating the general principles of the invention and should not be taken in a limiting sense. The scope of the invention is best determined by reference to the appended claims. The capacitor structure for an integrated circuit of the invention will be described in the following with reference to the accompanying drawings.

Figure 1:
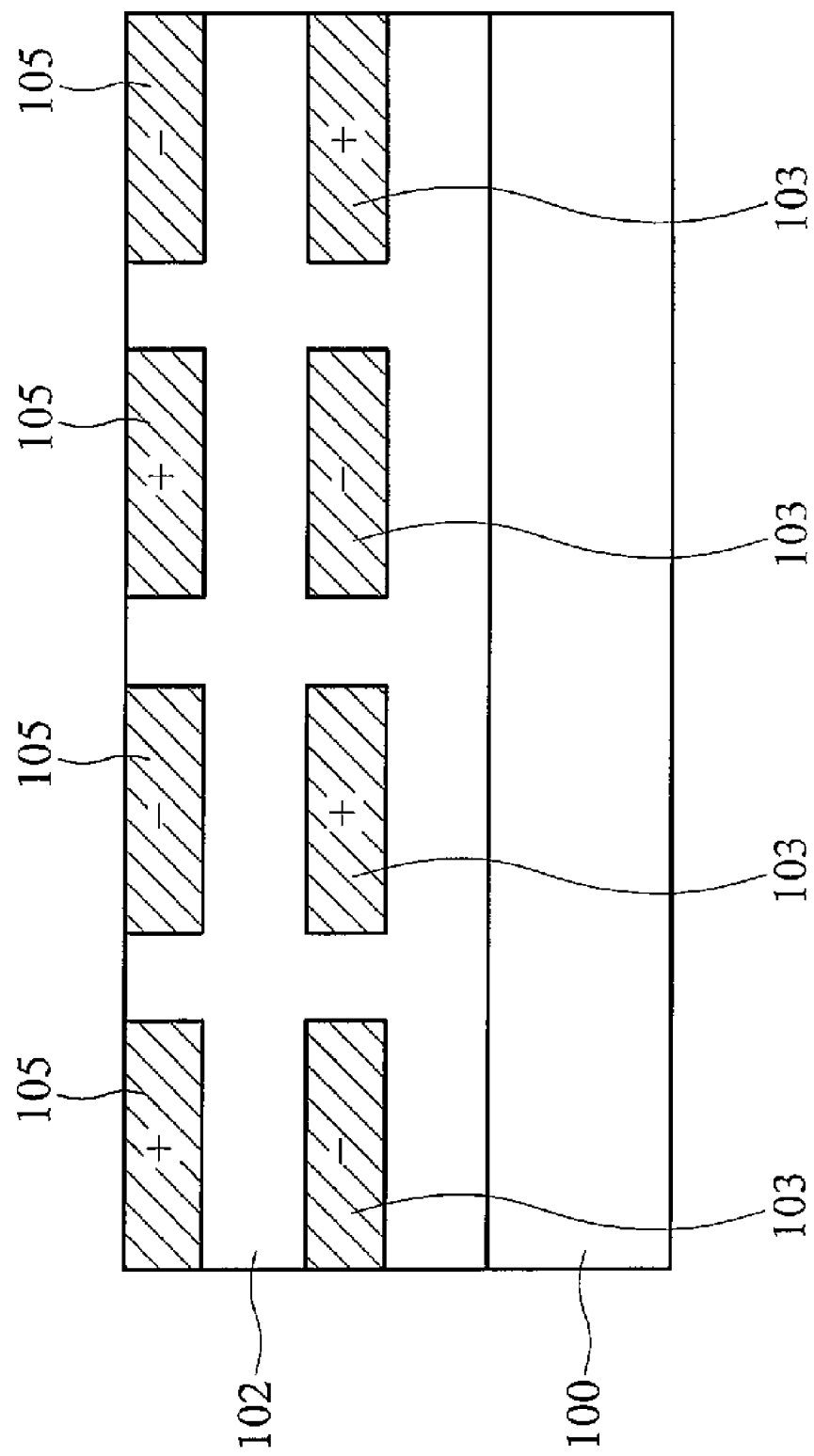
FIG. 1 is a cross section of a conventional parallel interdigitated capacitor structure for an integrated circuit.
Figure 2A:
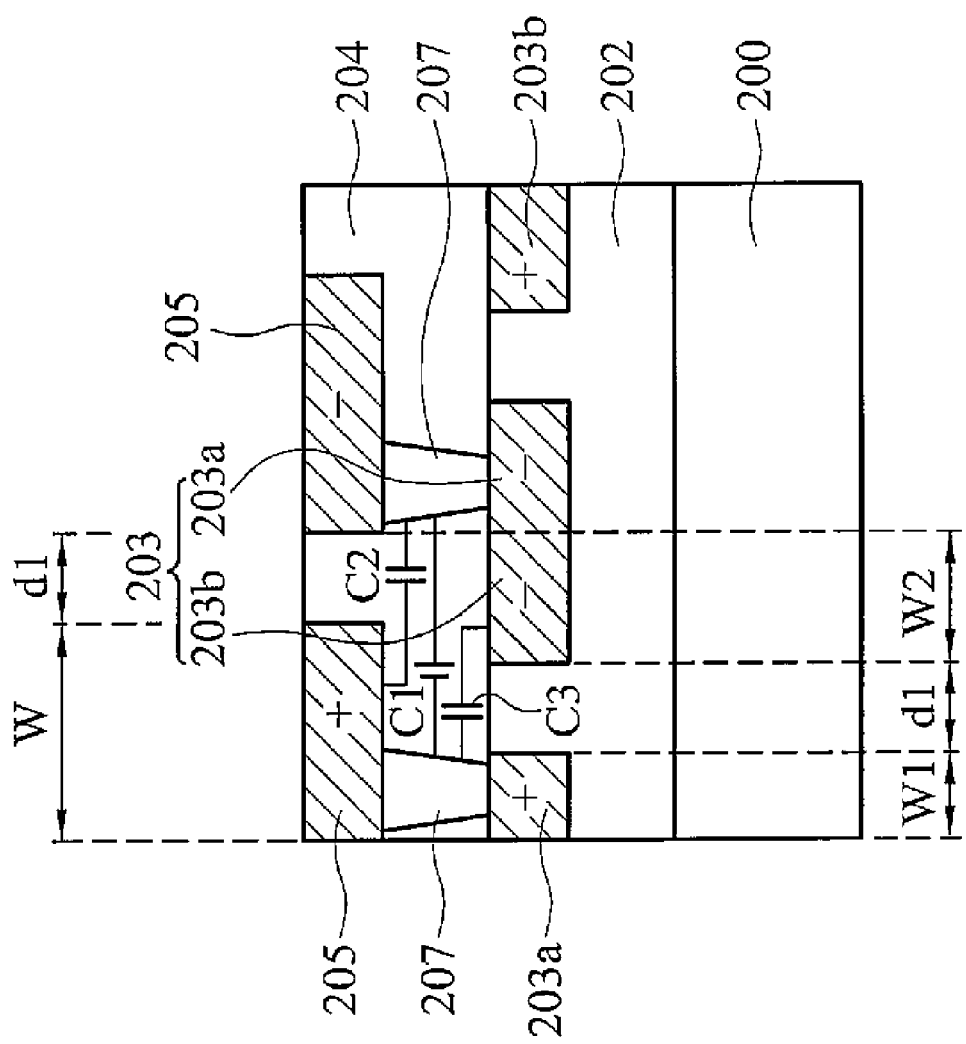
FIG. 2A is a cross section of an embodiment of two juxtaposed capacitor structure units.
Figure 2B:
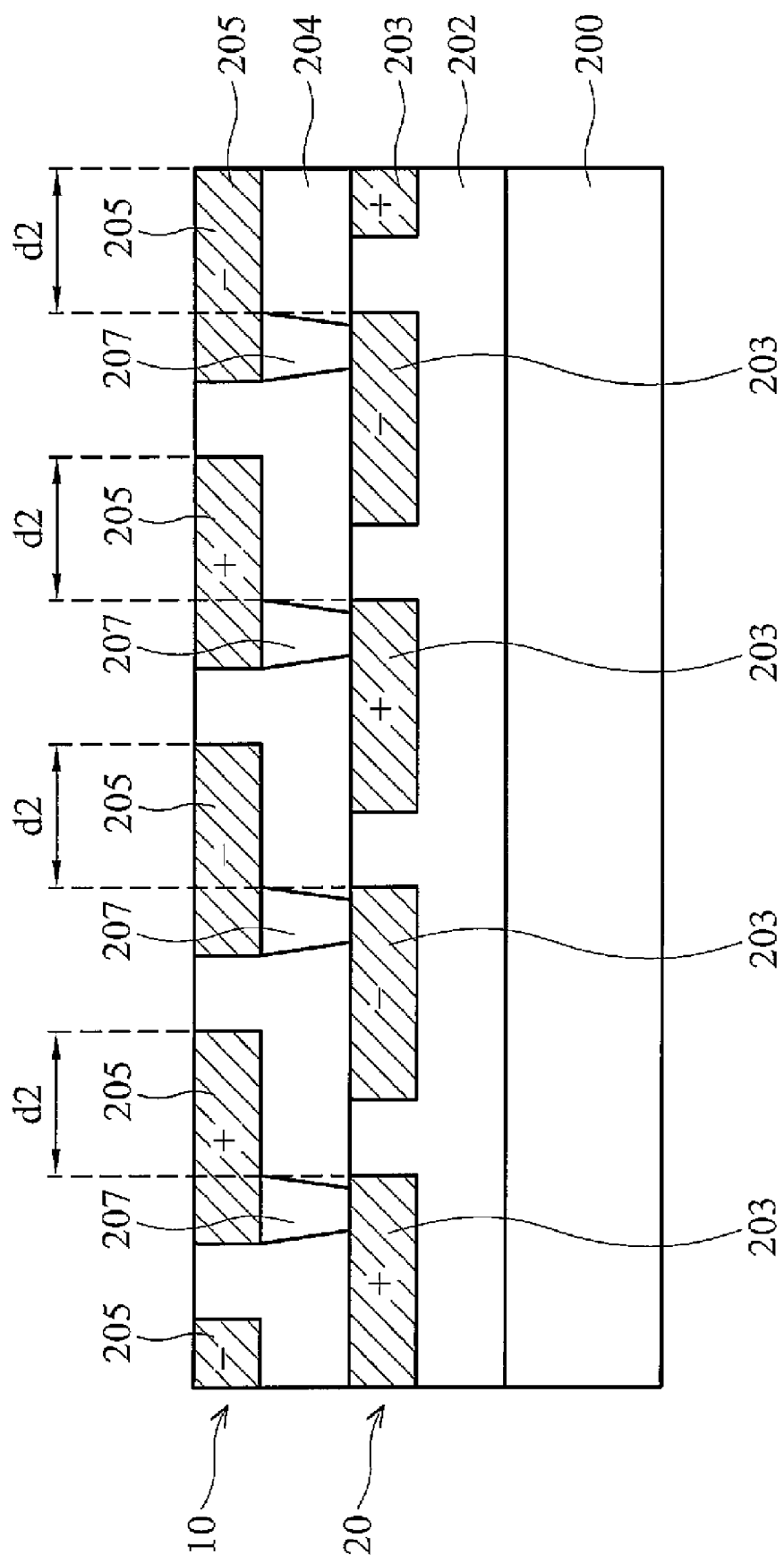
FIG. 2B is a cross section of an embodiment of a multi-capacitor structure constituting repeated juxtaposition of capacitor structure units shown in FIG. 2A.

The invention relates to an improved capacitor structure for different integrated circuit designs, such as mixed signal, radio frequency, and analog circuits. FIG. 2A is a cross section of an embodiment of two juxtaposed capacitor structure units and FIG. 2B is a cross section of an embodiment of a multi-capacitor structure constituting repeated juxtaposition of capacitor structure units shown in FIG. 2A. As shown in FIG. 2A, the capacitor structure unit comprises an insulating layer and conductive lines 203 and 205 embedded therein. The insulating layer may be an intermetal dielectric (IMD) layer disposed on a substrate 200. The substrate 200, such as a silicon substrate or other semiconductor substrates, may contain a variety of elements, including, for example, transistors, resistors, and other semiconductor elements as are well known in the art. In order to simplify the diagram, a flat substrate is depicted. The insulating layer may be a single layer or a multilayer structure. In this embodiment, the insulating layer comprises a dielectric layer 202 and an overlying dielectric layer 204. Moreover, the dielectric layers 202 and 204 may comprise different materials, such as silicon oxide and silicon nitride.

The conductive line 205 is embedded in a first level of the insulating layer and the conductive line 203 is embedded in a second level of the insulating layer lower than the first level. For example, the conductive line 205 can be embedded in the dielectric layer 204 and the conductive line 203 embedded in the dielectric layer 202. The conductive line 203 comprises a first conductive portion 203a and a second conductive portion 203b. In this embodiment, the first conductive portion 203a and the second conductive portion 203b in the same capacitor structure unit are separated by a predetermined space d1 (i.e. line space) and have opposing polarities labeled by "+" and "−". Moreover, the first conductive portion 203a and the second conductive portion 203b in different capacitor structure units laterally contact each other and have the same polarity. Additionally, the conductive lines 205 in different capacitor structure units are separated by the predetermined space d1.

The first conductive portion 203a has a projection onto the substrate 200 completely covered by the conductive line 205 and the second conductive portion 203b has a projection onto the substrate 200 partially covered by the conductive line 205. Moreover, at least one conductive plug 207 is disposed and coupled between the conductive line 205 and the first conductive portion 203a. The conductive lines 203 and 205 have substantially the same line width W and the first and second conductive portions 203a and 203b have line widths W1 and W2, respectively (i.e. W=W1+W2). Moreover, the conductive lines 203 and 205 comprise copper, aluminum or alloys thereof.

Such a capacitor structure unit can be repeatedly arranged along a horizontal direction to constitute a multi-capacitor structure, as shown in FIG. 2B. The multi-capacitor structure comprises a conductive line pattern 10 comprising a plurality of parallel conductive lines 205 separated by the predetermined space d1 and a conductive line pattern 20 comprising a plurality of parallel conductive lines 203 separated by the predetermined space d1. The adjacent conductive lines 205 have opposing polarities. Moreover, the conductive line pattern 20 shifts along a predetermined direction with respect to the conductive line pattern 10 by a predetermined space d2, in which the predetermined space d2 is wider than the predetermined space d1, but narrower than the line width W of the conductive line 203 or 205 (i.e. d1<d2<W). Each conductive line 205 is coupled to the corresponding conductive line 203 shifted along the predetermined direction by the conductive plug 207, such that the adjacent conductive lines 203 have opposing polarities.

In this embodiment, the second conductive line pattern 20 shifts with respect to the first conductive line pattern 10. Moreover, the conductive plug 207 acts as a support between the conductive lines 203 and 205. Thus, the structural strength of the capacitor structure can be enhanced to mitigate the dishing induced by CMP, thereby mitigating capacitor mismatch. Moreover, the use of the conductive plug 207 to couple the conductive lines 203 and 205 can increase surface area of the electrode plates of the capacitor, thereby further mitigating capacitor mismatch to improve performance of the integrated circuit. Additionally, compared to the conventional capacitor structure without conductive plugs between electrode plates, the capacitor structure of the invention provides additional capacitors C1, formed between the adjacent plugs 207, C2, formed between the conductive line 205 and the conductive plug 207, and C3, formed between the conductive line 203 and the conductive plug 207, as shown in FIG. 2A.

Figure 3A:
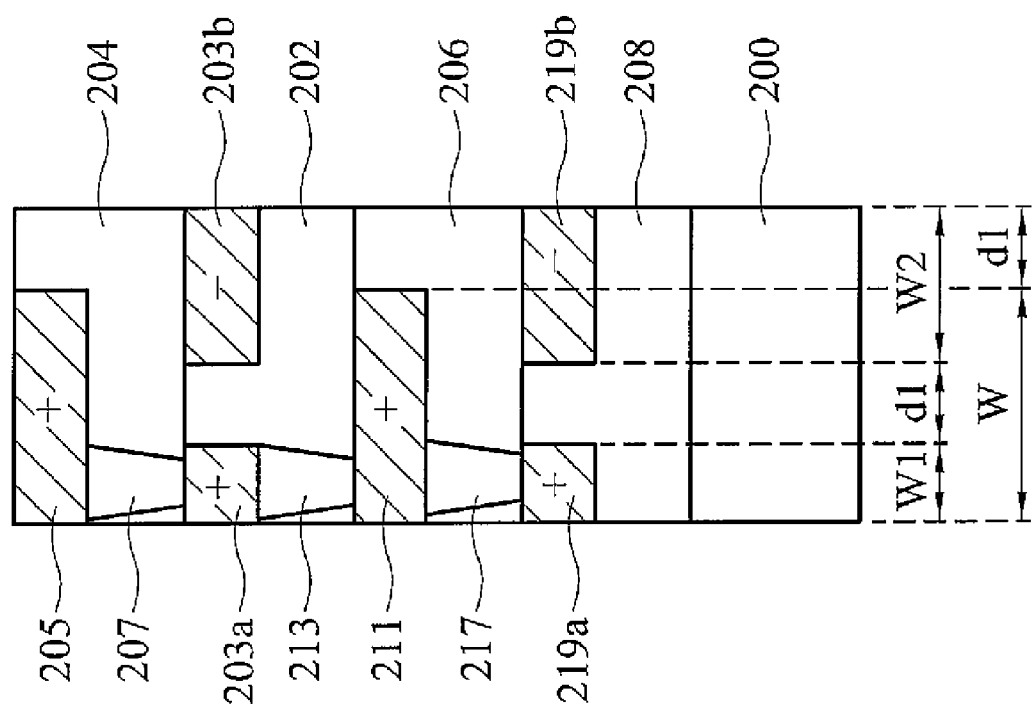
FIG. 3A is a cross section of an embodiment of two stacked capacitor structure units.
Figure 3B:
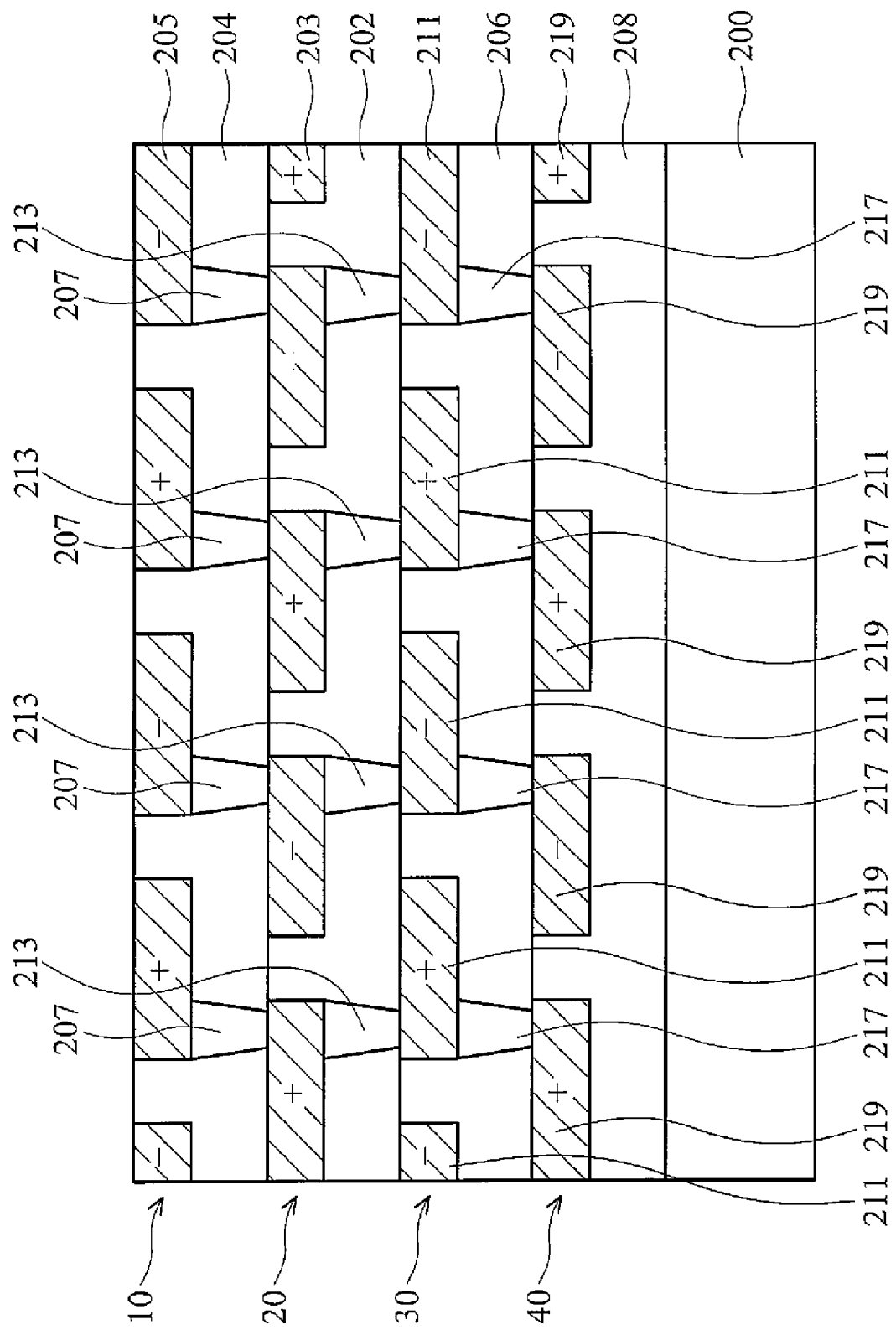
FIG. 3B is a cross section of an embodiment of a multi-capacitor structure constituting repeated juxtaposition of capacitor structure units shown in FIG. 3A.

FIG. 3A is a cross section of an embodiment of two stacked capacitor structure units and FIG. 3B is a cross section of an embodiment of a multi-capacitor structure constituting repeated juxtaposition of capacitor structure units shown in FIG. 3A. Elements in FIGS. 3A and 3B the same as in FIGS. 2A and 2B are labeled the same and not described again. As shown in FIG. 3A, the insulating layer on the substrate 200 further comprises dielectric layers 206 and 208 successively located under the dielectric layer 202. A conductive line 211 is embedded in the dielectric layer 206 and first and second conductive portions 219a and 219b are embedded in the dielectric layer 208, such that the conductive line 211 is located at a third level of the insulating layer lower than the second level and the first and second conductive portions 219a and 219b are located a fourth level of the insulating layer lower than the third level. The conductive line 211 is substantially aligned with the conductive line 205 and coupled to the first conductive portion 203a of the conductive line 203 by at least one conductive plug 213 disposed in the dielectric layer 202. The first and second conductive portions 219a and 219b are substantially aligned with the first and second conductive portions 203a and 203b, respectively. That is, the first and second conductive portions 219a and 219b are separated by the predetermined space d1.

The first conductive portion 219a has a projection onto the substrate 200 completely covered by the conductive line 211 and the second conductive portion 219b has a projection onto the substrate 200 partially covered by the conductive line 211. The first and second conductive portions 219a and 219 have opposing polarities labeled by "+" and "−". Moreover, at least one conductive plug 217 is disposed and coupled between the conductive line 211 and the first conductive portion 219a, in which both conductive plugs 213 and 217 are substantially aligned with the conductive plug 207. The conductive lines 211 and 205 have substantially the same line width W and the first and second conductive portions 219a and 219b have line widths W1 and W2, respectively. Moreover, the conductive line 211 and the first and second conductive portions 219a and 219b may comprise copper, aluminum or alloys thereof.

The stacked capacitor structure units can be repeatedly arranged along a horizontal direction to constitute a multi-capacitor structure, as shown in FIG. 3B. Unlike the multi-capacitor structure shown in FIG. 2B, the multi-capacitor structure shown in FIG. 3B further comprises conductive line patterns 30 and 40 located at the third and fourth levels of the insulating layer, respectively. The third conductive line pattern 30 comprises a plurality of parallel conductive lines 211 separated by the predetermined space d1. The conductive line pattern 40 comprises a plurality of parallel conductive lines 219 separated by the predetermined space d1, in which each conductive line 219 constitutes the first conductive portion 219a and the second conductive portion 219b laterally contacting thereto. The adjacent conductive lines 211 also have opposing polarities. Moreover, the conductive line pattern 30 is substantially aligned with the conductive line pattern 10 and the conductive line pattern 40 shifts along a predetermined direction with respect to the conductive line pattern 30 by a predetermined space d2. That is, the conductive line pattern 40 is substantially aligned with the conductive lie pattern 20. In this embodiment, each conductive line 211 is coupled to the corresponding conductive line 219 shifted along the predetermined direction by the conductive plug 217, such that the adjacent conductive lines 219 have opposing polarities.

Figure 4A:
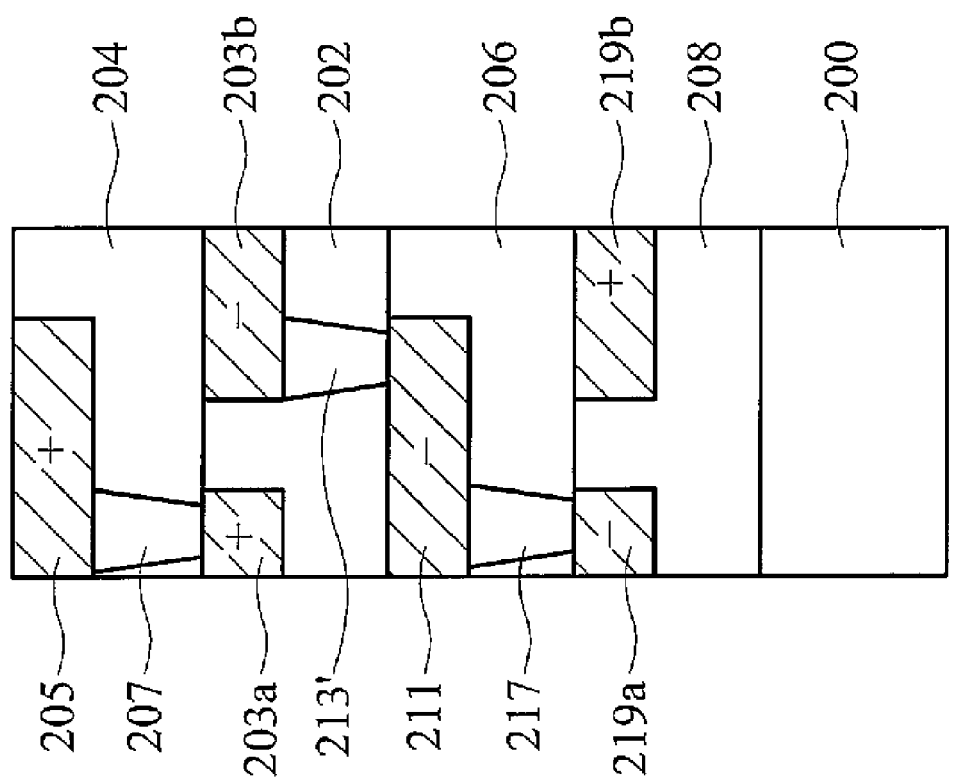
FIG. 4A is a cross section of an embodiment of two stacked capacitor structure units.
Figure 4B:
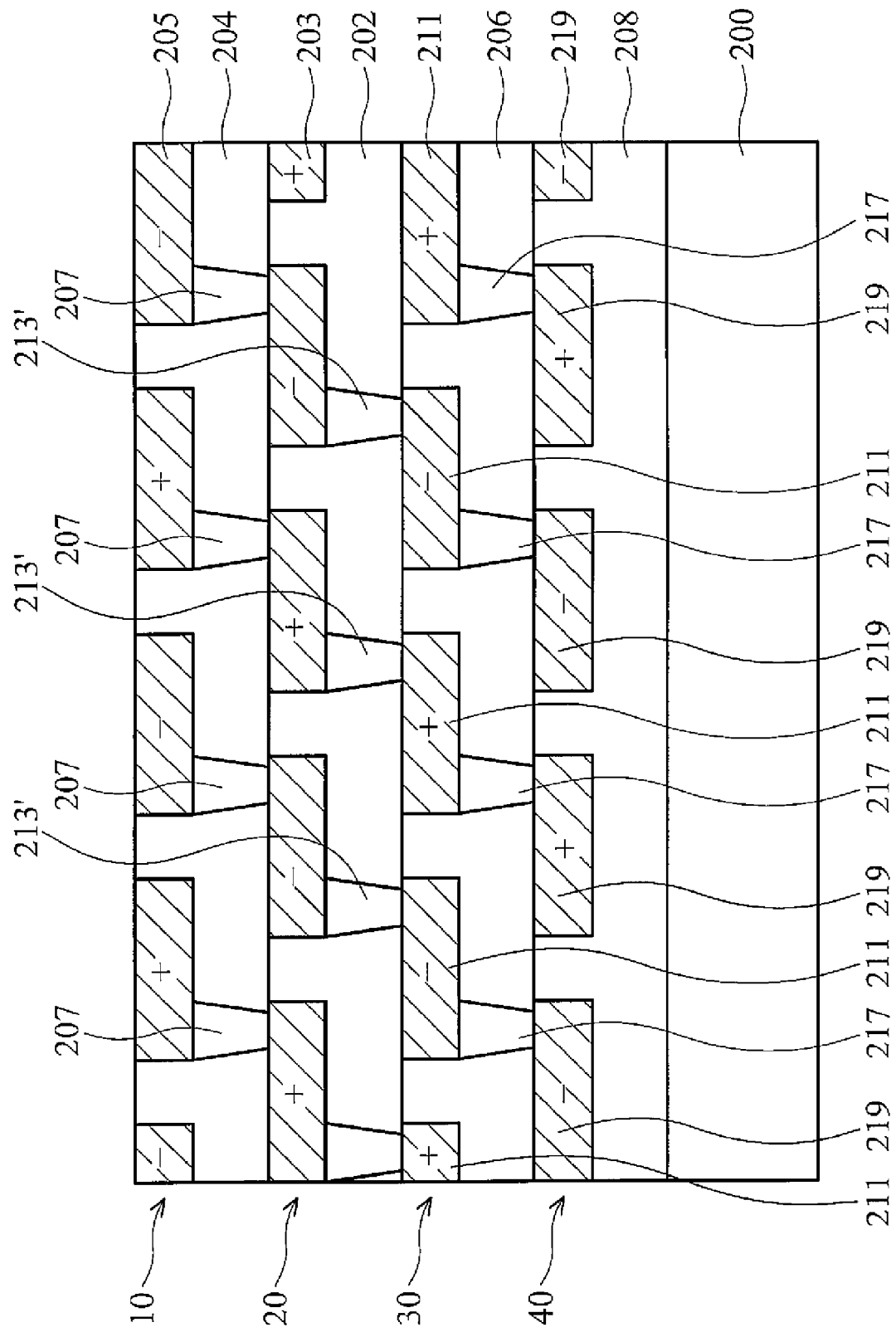
FIG. 4B is a cross section of an embodiment of a multi-capacitor structure constituting repeated juxtaposition of capacitor structure units shown in FIG. 4A.

FIG. 4A is a cross section of an embodiment of two stacked capacitor structure units and FIG. 4B is a cross section of an embodiment of a multi-capacitor structure constituting repeated juxtaposition of capacitor structure units shown in FIG. 4A. Elements in FIGS. 4A and 4B the same as in FIGS. 3A and 3B are labeled the same and not described again. As shown in FIG. 4A, unlike the stacked capacitor structure units shown in FIG. 3A, the conductive line 211 is coupled to the second conductive portion 203b of the conductive line 203 by at least one conductive plug 213' disposed in the dielectric layer 202. As shown in FIG. 4B, unlike the multi-MIM capacitor structure shown in FIG. 3B, the conductive plug 213' is not aligned with the conductive plugs 207 and 217, such that each conductive line 205 and the corresponding conductive line 211 have opposing polarities as do each conductive line 203 and the corresponding conductive line 219.

Figure 5A:
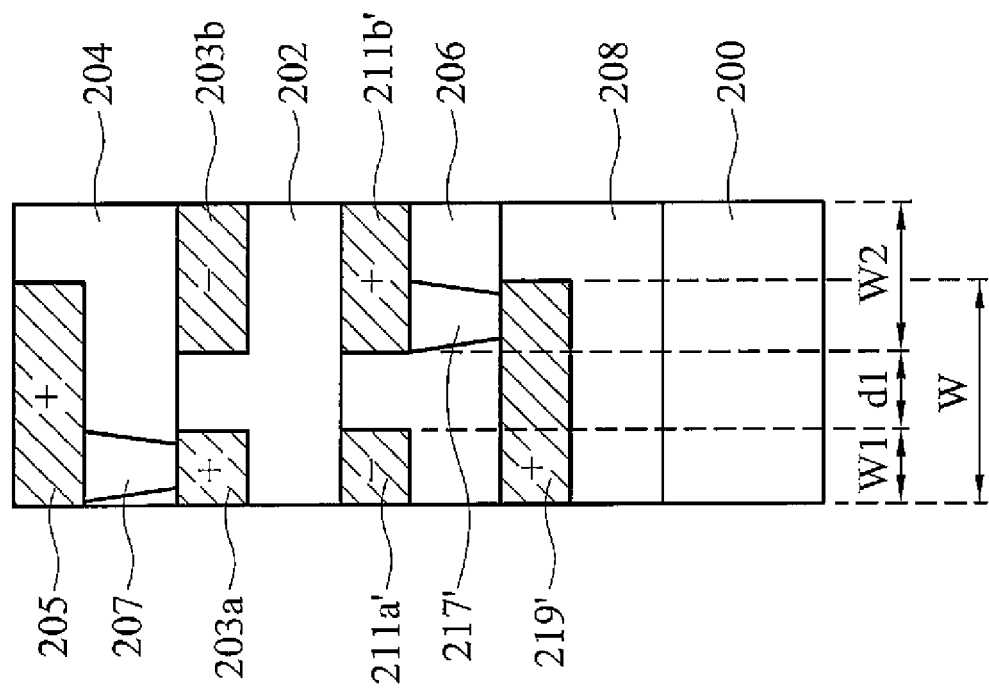
FIG. 5A is a cross section of an embodiment of two stacked capacitor structure units.
Figure 5B:
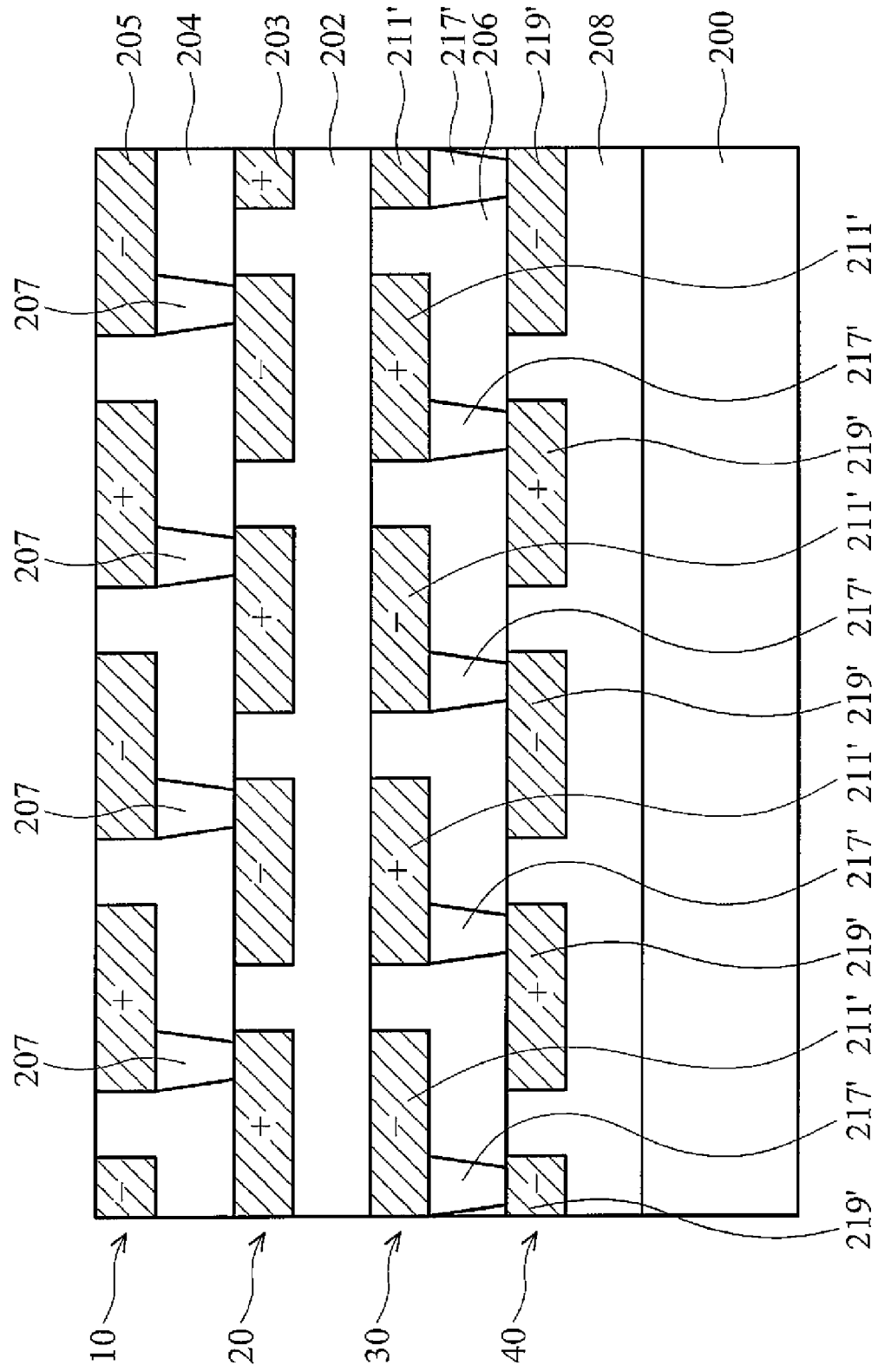
FIG. 5B is a cross section of an embodiment of a multi-capacitor structure constituting repeated juxtaposition of capacitor structure units shown in FIG. 5A.

FIG. 5A is a cross section of an embodiment of two stacked capacitor structure units and FIG. 5B is a cross section of an embodiment of a multi-capacitor structure constituting repeated juxtaposition of capacitor structure units shown in FIG. 5A. Elements in FIGS. 5A and 5B the same as in FIGS. 3A and 3B are labeled the same and not described again. As shown in FIG. 5A, a conductive line 219' is embedded in the dielectric layer 208 and first and second conductive portions 211a' and 211b' are embedded in the dielectric layer 206, such that the first and second conductive portions 211a' and 211b' are located at a third level of the insulating layer lower than the second level and the conductive line 219' is located at a fourth insulating layer lower than the third level. The conductive line 219' is substantially level and aligned with the conductive line 205 and coupled to the second conductive portion 211b' by at least one conductive plug 217' disposed in the dielectric layer 206. The first and second conductive portions 211a' and 211b' are substantially aligned with the first and second conductive portions 203a and 203b. That is, the first and second conductive portions 211a' and 211b' are separated by the predetermined space d1.

The first conductive portion 211a' and the first conductive portion 203a of the conductive line 203 have opposing polarities and the second conductive portion 211b' and the second conductive portion 203b of the conductive line 203 have opposing polarities labeled by "+" and "−". The conductive lines 219' and 205 have substantially the same line width W and the first and second conductive portions 211a' and 211b' have line widths W1 and W2, respectively. Moreover, the conductive line 219' and the first and second conductive portions 211a' and 211b' may comprise copper, aluminum or alloys thereof.

The stacked capacitor structure units can be repeatedly arranged along a horizontal direction to constitute a multi-MIM capacitor structure, as shown in FIG. 5B. Unlike the multi-capacitor structure shown in FIG. 4B, the third conductive line pattern 30 comprises a plurality of parallel conductive lines 211' separated by the predetermined space d1 and is substantially aligned with the conductive line pattern 20, in which each conductive line 211' constitutes the first conductive portion 211a' and the second conductive portion 211b' laterally contacted thereto. The conductive line pattern 40 comprises a plurality of parallel conductive lines 219' separated by the predetermined space d1 and is substantially aligned with the conductive line pattern 10. Moreover, the conductive line pattern 20 is not coupled to the conductive line pattern 30. The adjacent conductive lines 211' have opposing polarities. The adjacent conductive lines 219' also have opposing polarities. Additionally, each conductive line 205 and the corresponding conductive line 219' have the same polarity. Each conductive line 203 and the corresponding conductive line 211' have opposing polarities.

In the disclosed embodiments, a conductive line pattern shifts with respect to one adjacent thereto. Moreover, the conductive plug acts as a support between the adjacent conductive lines. Accordingly, capacitor mismatch can be mitigated. Moreover, the use of the conductive plugs to couple the conductive lines located in different levels increases surface area of the electrode plates of the capacitor, further mitigating capacitor mismatch to improve performance of the integrated circuit.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A capacitor structure for an integrated circuit, comprising:
    an insulating layer disposed on a substrate;
    a first conductive line embedded in a first level of the insulating layer;
    a second conductive line embedded in a second level of the insulating layer lower than the first level and having a projection onto the substrate completely covered by the first conductive line; and
    a third conductive line embedded in the second level of the insulating layer, separated from the second conductive line by a predetermined space and having a projection onto the substrate partially covered by the first conductive line;
    wherein the second conductive line is coupled to the first conductive line by at least one first conductive plug and has a polarity opposite to the third conductive line;

wherein the first, second and third conductive lines have first, second and third line widths, respectively, and the first line width is substantially equal to the sum of the second and third line widths.

2. The capacitor structure as claimed in claim 1, wherein the first, second and third conductive lines comprise copper, aluminum or alloys thereof.

3. The capacitor structure as claimed in claim 1, further comprising:
a fourth conductive line embedded in the first level of the insulating layer and separated from the first conductive line by the predetermined space;
a fifth conductive line embedded in the second level of the insulating layer, laterally contacting the third conductive line and having a projection onto the substrate completely covered by the fourth conductive line; and
a sixth conductive line embedded in the second level of the insulating layer, separated from the fifth conductive line by the predetermined space, and having a projection onto the substrate partially covered by the fourth conductive line;
wherein the fifth conductive line is coupled to the fourth conductive line by at least one second conductive plug and has a polarity opposite to the sixth conductive line.

4. The capacitor structure as claimed in claim 3, wherein the fourth, fifth and sixth conductive lines respectively have fourth, fifth and sixth line widths substantially equal to the first, second and third line widths.

5. The capacitor structure as claimed in claim 4, wherein the fourth, fifth and sixth conductive lines comprise copper, aluminum or alloys thereof.

6. The capacitor structure as claimed in claim 1, further comprising a fourth conductive line embedded in a third level of the insulating layer lower than the second level, substantially aligned with the first conductive line and coupled to the second conductive line by at least one second conductive plug.

7. The capacitor structure as claimed in claim 6, further comprising:
a fifth conductive line embedded in a fourth level of the insulating layer lower than the third level and having a projection onto the substrate completed covered by the fourth conductive line; and
a sixth conductive line embedded in the fourth level of the insulating layer and separated from the fifth conductive line by the predetermined space;
wherein the fifth conductive line is coupled to the fourth conductive line by at least one third conductive plug and has a polarity opposite to the sixth conductive line.

8. The capacitor structure as claimed in claim 7, wherein the second and third conductive plugs are substantially aligned with the first conductive plug.

9. The capacitor structure as claimed in claim 7, wherein the fourth, fifth and sixth conductive lines respectively have fourth, fifth and sixth line widths substantially equal to the first, second and third line widths.

10. The capacitor structure as claimed in claim 1, further comprising a fourth conductive line embedded in a third level of the insulating layer lower than the second level, substantially aligned with the first conductive line and coupled to the third conductive line by at least one second conductive plug.

11. The capacitor structure as claimed in claim 10, further comprising:
a fifth conductive line embedded in a fourth level of the insulating layer lower than the third level and having a projection onto the substrate completed covered by the fourth conductive line; and
a sixth conductive line embedded in the fourth level of the insulating layer and separated from the fifth conductive line by the predetermined space;
wherein the fifth conductive line is coupled to the fourth conductive line by at least one third conductive plug and has a polarity opposite to the sixth conductive line.

12. The capacitor structure as claimed in claim 11, wherein the fourth, fifth and sixth conductive lines respectively have fourth, fifth and sixth line widths substantially equal to the first, second and third line widths.

13. The capacitor structure as claimed in claim 11, wherein the third conductive plug is substantially aligned with the first conductive plug.

14. The capacitor structure as claimed in claim 1, further comprising:
a fourth conductive line embedded in a third level of the insulating layer lower than the second level and substantially aligned with the second conductive line;
a fifth conductive line embedded in the third level of the insulating layer, separated from the fourth conductive line by the predetermined space and substantially aligned with the third conductive line; and
a sixth conductive line embedded in a fourth level of the insulating layer lower than the third level and substantially aligned with the first conductive line;
wherein the fifth conductive line is coupled to the sixth conductive line by at least one second conductive plug and has a polarity opposite to the fourth conductive line.

15. The capacitor structure as claimed in claim 14, wherein the fourth, fifth and sixth conductive lines respectively have fourth, fifth and sixth line widths substantially equal to the second, third and first line widths.

16. The capacitor structure as claimed in claim 14, wherein the second and fifth conductive lines have the same polarity.

17. A capacitor structure for an integrated circuit, comprising:
an insulating layer disposed on a substrate;
a first conductive line pattern embedded in a first level of the insulating layer and comprising a plurality of parallel first conductive lines separated by a first space, wherein the adjacent first conductive lines have opposing polarities; and
a second conductive line pattern embedded in a second level of the insulating layer lower than the first level and comprising a plurality of parallel second conductive lines separated by the first space;
wherein the second conductive line pattern shifts along a predetermined direction with respect to the first conductive line pattern by a second space and each first conductive line is coupled to a corresponding and shifted second conductive line by at least one first conductive plug;
wherein the first and second conductive line patterns have substantially the same line width, and the second space is narrower than the line width and wider than the first space.

18. The capacitor structure as claimed in claim 17, further comprising a third conductive line pattern embedded in a third level of the insulating layer lower than the second level, substantially aligned with the first conductive line pattern and comprising a plurality of parallel third conductive lines separated by the first space, wherein each third conductive line is coupled to a corresponding and shifted second conductive line by at least one second conductive plug substantially aligned with the first conductive plug.

19. The capacitor structure as claimed in claim 17, further comprising a third conductive line pattern embedded in a third level of the insulating layer lower than the second level and comprising a plurality of parallel third conductive lines separated by the first space, wherein the third conductive line pattern shifts along the predetermined direction with respect to the second conductive line pattern by the second space and each second conductive line is coupled to a corresponding and shifted third conductive line by at least one second conductive plug.

20. The capacitor structure as claimed in claim 17, further comprising:

a third conductive line pattern embedded in a third level of the insulating layer lower than the second level and comprising a plurality of parallel third conductive lines separated by the first space, wherein the adjacent third conductive lines have opposing polarities; and a fourth conductive line pattern embedded in a fourth level of the insulating layer lower than the third level and comprising a plurality of parallel fourth conductive lines separated by the first space;

wherein the third conductive line pattern is substantially aligned with the second conductive line pattern, the fourth conductive line pattern shifts along the predetermined direction with respect to the third conductive line pattern by the second space and each third conductive line is coupled to a corresponding and shifted fourth conductive line by at least one second conductive plug.

21. The capacitor structure as claimed in claim 20, wherein each second conductive line and the substantially aligned third conductive line have opposing polarities.

* * * * *